US012745407B2

(12) United States Patent
Dey et al.

(10) Patent No.: US 12,745,407 B2
(45) Date of Patent: Sep. 22, 2026

(54) RESISTOR STRUCTURE INCLUDING CHARGE CONTROL LAYER

(71) Applicant: TEXAS INSTRUMENTS INCORPORATED, Dallas, TX (US)

(72) Inventors: Sagnik Dey, Frisco, TX (US); Dhanoop Varghese, Plano, TX (US); Dong Seup Lee, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 683 days.

(21) Appl. No.: 17/737,515

(22) Filed: May 5, 2022

(65) Prior Publication Data

US 2023/0361222 A1 Nov. 9, 2023

(51) Int. Cl.

*H10D 1/43* (2025.01)
*H10D 1/00* (2025.01)
*H10D 48/01* (2025.01)
*H10D 62/824* (2025.01)
*H10D 62/85* (2025.01)

(52) U.S. Cl.

CPC ............... *H10D 1/43* (2025.01); *H10D 1/025* (2025.01); *H10D 48/021* (2025.01); *H10D 62/824* (2025.01); *H10D 62/8503* (2025.01)

(58) Field of Classification Search

CPC .... H10D 62/824; H10D 64/667; H10D 30/47; H10D 30/471; H10D 30/015; H10D 62/82; H10D 48/38; H10D 1/01; H10D 1/40; H01L 29/7787; H01L 21/28088

See application file for complete search history.

(56) References Cited

U.S. PATENT DOCUMENTS

2014/0246760 A1* 9/2014 Strassburg ......... H10D 62/8164 257/637
2020/0373407 A1* 11/2020 Shih ..................... H10D 64/513
2021/0265494 A1* 8/2021 Miyajima ........... H01L 21/8252
2022/0399328 A1* 12/2022 Kaufmann ......... H10D 62/8503

OTHER PUBLICATIONS

Pending U.S. Appl. No. 17/548,426, filed Dec. 10, 2021, first inventor: Maik Kaufmann.

* cited by examiner

*Primary Examiner* — Alia Sabur
(74) *Attorney, Agent, or Firm* — Yudong Kim; Frank D. Cimino

(57) ABSTRACT

The present disclosure generally relates to a resistor structure having a charge control layer. In an example, an integrated circuit includes a semiconductor substrate, a dielectric layer, a first contact, a second contact, and a charge control layer. The semiconductor substrate includes a semiconductor hetero-structure. The dielectric layer is disposed over the semiconductor substrate. The first contact is disposed through the dielectric layer and contacting the semiconductor hetero-structure. The second contact is disposed through the dielectric layer and contacting the semiconductor hetero-structure. The second contact is disposed laterally separated from the first contact. The charge control layer is disposed over the semiconductor hetero-structure and laterally between the first contact and the second contact. At least a portion of the dielectric layer is disposed between the charge control layer and the semiconductor hetero-structure.

24 Claims, 7 Drawing Sheets

RESISTOR STRUCTURE INCLUDING CHARGE CONTROL LAYER

BACKGROUND

A two-dimensional electron gas (2DEG) is a scientific model in solid state physics that generally observes that, under some circumstances, an electron gas is free to move in two dimensions in a space and is tightly confined in a third dimension. A 2DEG can be realized by implementing materials with proper band gaps. 2DEGs can be implemented in semiconductor devices, which may further be implemented within integrated circuits. Example semiconductor devices in which a 2DEG can be implemented include transistors, such as a high electron mobility transistor (HEMT), and resistors.

SUMMARY

An example described herein is an integrated circuit. The integrated circuit includes a semiconductor substrate, a dielectric layer, a first contact, a second contact, and a charge control layer. The semiconductor substrate includes a semiconductor hetero-structure. The dielectric layer is disposed over the semiconductor substrate. The first contact is disposed through the dielectric layer and contacting the semiconductor hetero-structure. The second contact is disposed through the dielectric layer and contacting the semiconductor hetero-structure. The second contact is disposed laterally separated from the first contact. The charge control layer is disposed over the semiconductor hetero-structure and laterally between the first contact and the second contact. At least a portion of the dielectric layer is disposed between the charge control layer and the semiconductor hetero-structure.

Another example is a method of semiconductor processing. A dielectric layer is formed over a semiconductor hetero-structure. A first contact and a second contact are formed through the dielectric layer to the semiconductor hetero-structure. The first contact is laterally separated from the second contact. A charge control layer is formed laterally between the first contact and the second contact. At least a portion of the dielectric layer is disposed between the charge control layer and the semiconductor hetero-structure.

A further example is an integrated circuit. The integrated circuit includes a resistor structure. The resistor structure includes a hetero-structure, a first contact, a second contact, and a charge control layer. The hetero-structure includes an epitaxial layer disposed over a dissimilar semiconductor material. The first contact is disposed through a dielectric layer over the hetero-structure. The first contact electrically contacts the dissimilar semiconductor material. The second contact is disposed through the dielectric layer and laterally separate from the first contact. The second contact electrically contacts the dissimilar semiconductor material. The charge control layer is disposed over the hetero-structure and laterally between the first contact and the second contact. At least a portion of the dielectric layer is disposed between the charge control layer and the hetero-structure.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figure 1:
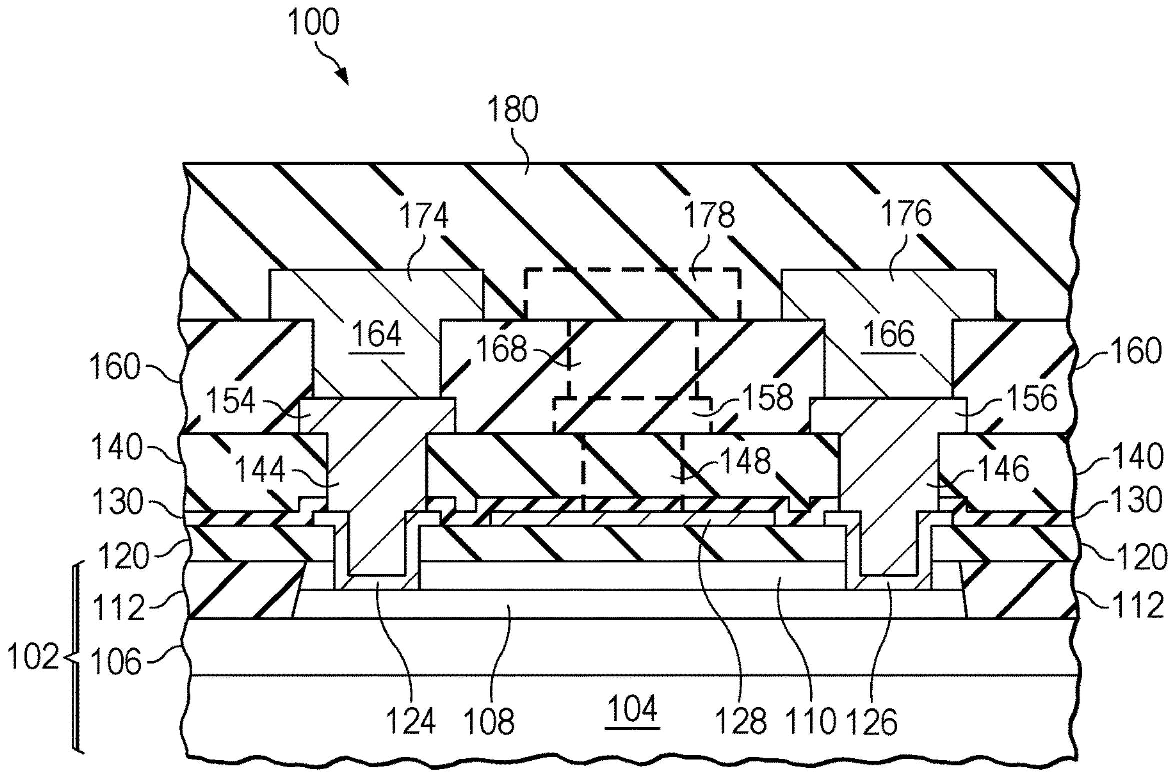
FIG. 1 is a cross-sectional view of a first semiconductor device structure according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) and may be implemented with more or fewer operations.

The present disclosure relates to a resistor structure having a charge control layer. In some examples, a resistor structure forms a two-dimensional electron gas (2DEG) resistor. The resistor structure can be included in an integrated circuit. The resistor structure includes a hetero-structure (e.g., including a heterojunction). The hetero-structure can include a first epitaxial layer and a second epitaxial layer disposed over the first epitaxial layer. A dielectric layer is disposed over the hetero-structure, and first and second contacts are disposed through the dielectric layer and contacting the hetero-structure. In operation, a resistor channel is formed in the hetero-structure between the first and second contacts. The charge control layer is disposed laterally between the first and second contacts, and at least a portion of the dielectric layer is disposed between the charge control layer and the hetero-structure. The charge control layer can be an electrically floating node or can be electrically connected to other circuitry, which may control a voltage of the charge control layer. As described below, the charge control layer can reduce drift of the resistance of the resistor channel of the resistor structure.

2DEG resistors can implement a heterojunction between two dissimilar materials where the materials are capable of forming a 2DEG sheet channel at the heterojunction. The dissimilar materials can have conduction band energies that result in a thin sheet channel in one of the materials at the heterojunction, where the conduction band energy of that material is below the Fermi level. For example, assuming an aluminum gallium nitride (AlGaN) and gallium nitride (GaN) hetero-structure (e.g., with an AlGaN/GaN interface), the AlGaN can have a relatively high conduction band energy well above the Fermi level. At the AlGaN/GaN interface and into the GaN, the conduction band energy drops below the Fermi level, and in the GaN moving away from the AlGaN/GaN interface, the conduction band energy subsequently rises above the Fermi level. This drop of the conduction band energy below the Fermi level allows for the formation of a 2DEG sheet in the GaN, as an example. Sufficient ionized surface charge donor states should be present at the free top surface of the heterojunction (e.g., AlGaN surface) to achieve the conduction band energies for formation of the 2DEG sheet channel.

Over the lifetime of a 2DEG resistor, charges can be injected into, spread to, and/or migrate to and/or through various structures near or around the hetero-structure. For example, charges can be injected into, spread to, and/or migrate to and be accumulated in a dielectric layer that is disposed over the hetero-structure. The accumulated charge in the dielectric layer can cause charge donor states to be depleted at the surface of the material in the hetero-structure that interfaces with the dielectric layer. For example, the accumulated charges can attract charge donor states (e.g., due to the electric field generated by the accumulated charges) away from the heterojunction to a position more proximate to the dielectric layer. As the heterojunction becomes depleted of charge donor states, the resistance of the 2DEG resistor can begin to drift. For example, in some circumstances, it has been projected that the resistance can drift more that 10% after 10 years operating at 150° C. Drift of the resistance can result in products being unusable, particularly where the resistance is required to remain within a tight limit across the lifetime of the product and across the operating temperature. In some cases, charge donor states can become so depleted that the conduction band energies of the dissimilar materials do not drop below the Fermi level, and a 2DEG channel may not form.

According to some examples, a charge control layer is implemented in a resistor structure, such as a 2DEG resistor structure. The charge control layer may generally be a sink for charges injected into, spread to, and/or migrated in the resistor structure. The charge control layer may be sufficiently close to the hetero-structure to sink a sufficient percentage of charges. In some examples, the charge control layer is an electrically floating node. The charge control layer may accumulate the charges, e.g., in a low conduction band energy material, such as metal, and may be disposed some distance away from the hetero-structure such that any electric field generated by the accumulated charges may not significantly adversely affect the resistance in the hetero-structure. In some examples, the charge control layer is electrically connected to other circuitry. The other circuitry can supply and control a voltage of the charge control layer, which may drain charges and/or create an electric field that can maintain an appropriate level of charge donor states at the heterojunction. In examples where a charge control layer is included, drift of the resistance of the resistor structure may be reduced. Other benefits and advantages may be achieved.

FIG. 1 is a cross-sectional view of a semiconductor device structure 100 according to some examples. The semiconductor device structure 100 may further be included in an integrated circuit. More specifically, the semiconductor device structure 100, in some examples, is a resistor structure. The resistor structure may be a 2DEG resistor structure. A 2DEG resistor structure can be implemented by a number of different configurations. The structure shown in FIG. 1, and various materials described below, is merely an example to illustrate various aspects described herein.

The semiconductor device structure 100 includes a semiconductor substrate 102. The semiconductor substrate 102, in the illustrated example, includes a semiconductor hetero-structure (including a first epitaxial layer 108 and a second epitaxial layer 110) disposed over a support substrate 104. The support substrate 104 can be a bulk semiconductor substrate, a semiconductor-on-insulator (SOI) substrate, or any other appropriate substrate. In some examples, the support substrate 104 is or includes a silicon substrate (which may be singulated from a bulk silicon wafer at the conclusion of semiconductor processing). In the illustrated example, the semiconductor substrate 102 further includes a buffer structure 106 disposed over the support substrate 104 and between the support substrate 104 and the first epitaxial layer 108. The buffer structure 106 can be or include any material or combination of materials (e.g. different layers) to accommodate lattice mismatch between the material of the support substrate 104 and a material of the semiconductor hetero-structure (e.g., the first epitaxial layer 108), for example. In some examples, the buffer structure 106 can include multiple sub-layers having varying (e.g., increasing or decreasing) percentage of a given element of the material of the buffer structure 106.

The first epitaxial layer 108 is disposed over the support substrate 104, and in the illustrated example, is disposed over (e.g., disposed on) the buffer structure 106. The second epitaxial layer 110 is disposed over the first epitaxial layer 108. The first epitaxial layer 108 is or includes a semiconductor material (e.g., a crystalline semiconductor material), and the second epitaxial layer 110 is or includes a semiconductor material (e.g., a crystalline semiconductor material) different from the semiconductor material of the first epitaxial layer 108. As illustrated, a heterojunction is defined at an interface between the first epitaxial layer 108 and the second epitaxial layer 110. In some examples, the first epitaxial layer 108 and the second epitaxial layer 110 are each not substantially doped (e.g., are intrinsic and/or are not doped to a concentration exceeding $1\times10^{16}$ $cm^{-3}$). In some examples, the first epitaxial layer 108 may be unintentionally doped, and not substantially doped, such as by diffusion of dopants, residual dopants in a processing chamber during formation, or the like.

In some examples, the first epitaxial layer 108 is or includes gallium nitride (GaN), and the second epitaxial layer 110 is or includes aluminum gallium nitride (AlGaN). In such examples, the buffer structure 106 includes (i) a sub-layer of aluminum nitride (AlN) disposed on the support substrate 104, (ii) multiple sub-layers of aluminum gallium nitride ($Al_{(1-x)}Ga_xN$) disposed over the sub-layer of aluminum nitride, where a concentration of gallium (e.g., x) increases sequentially between the sub-layers in a direction away from the support substrate 104, and (iii) a sub-layer of carbon-doped gallium nitride (GaN:C) disposed on the upper-most sub-layer of aluminum gallium nitride. In other examples, the first epitaxial layer 108, the second epitaxial layer 110, and the buffer structure 106 may be or include other materials.

The semiconductor substrate 102 illustrated in FIG. 1 is provided as an example. A semiconductor substrate with a semiconductor hetero-structure can take any other appropriate configuration. For example, a support substrate having an epitaxial layer thereon (e.g., where an interface between the support substrate and the epitaxial layer form a hetero-junction) may form the semiconductor substrate with a semiconductor hetero-structure. As a specific example, a GaN substrate with an AlGaN epitaxial layer thereon may be the semiconductor substrate 102.

Isolation regions 112 are disposed in the semiconductor substrate 102. Each of the isolation regions 112 extend from a top surface of the semiconductor substrate 102 at least to a depth of the heterojunction (e.g., formed between the first epitaxial layer 108 and the second epitaxial layer 110) of the semiconductor hetero-structure, and further, at least to the buffer structure 106. In the illustrated example, the isolation regions 112 extend to a depth at an interface between the first epitaxial layer 108 and the buffer structure 106. In some examples, the isolation regions 112 can extend to a depth in the buffer structure 106, and further, can extend to a depth in the support substrate 104. The isolation regions 112 at least in part laterally define an active region of the semiconductor hetero-structure that forms a resistor. In some examples, the isolation regions 112 are highly resistive amorphized regions. In other examples, the isolation regions 112 can be or include shallow trench isolations (STIs), deep trench isolations (DTIs), a combination thereof, or the like.

As indicated previously, the first epitaxial layer 108 in the active region defined between the isolation regions 112 is not substantially doped, and further, does not include differently doped (e.g., by conductivity type and/or concentration) regions (such as source and/or drain regions or a channel region like in a transistor). Similarly, the second epitaxial layer 110 in the active region defined between the isolation regions 112 is not substantially doped, and further, does not include differently doped (e.g., by conductivity type and/or concentration) regions.

A first dielectric layer 120 is disposed over (e.g., possibly, disposed on) the semiconductor substrate 102. In the cross-section of FIG. 1, the first dielectric layer 120 has a substantially planar top surface (e.g., a surface distal from the semiconductor substrate 102) over the active region of the semiconductor hetero-structure. Further, in the cross-section of FIG. 1, the first dielectric layer 120 has a substantially uniform thickness. In some examples, the first dielectric layer 120 is or includes silicon nitride (SiN), which may further be a high quality nitride that has a high breakdown voltage. Other dielectric materials may be used for the first dielectric layer 120.

A first metal contact 124 and a second metal contact 126 each are disposed through the first dielectric layer 120 and the second epitaxial layer 110, and contact the first epitaxial layer 108. In the illustrated example, the first metal contact 124 is disposed conformally on sidewalls of an opening through the first dielectric layer 120 and the second epitaxial layer 110 and on an upper surface of the first epitaxial layer 108. Upper flange portions of the first metal contact 124 are also disposed over the top surface of the first dielectric layer 120. Likewise, the second metal contact 126 is disposed conformally on sidewalls of an opening through the first dielectric layer 120 and the second epitaxial layer 110 and on an upper surface of the first epitaxial layer 108. Upper flange portions of the second metal contact 126 are also disposed over the top surface of the first dielectric layer 120. In the illustrated example, the first metal contact 124 and the second metal contact 126 do not fill the respective openings, and in other examples the first metal contact 124 and the second metal contact 126 may fill the respective openings. The first metal contact 124 and the second metal contact 126 are disposed laterally separated from each other, and the semiconductor hetero-structure disposed laterally between the first metal contact 124 and the second metal contact 126 forms, at least in part, a resistor.

A metal charge control layer 128 is disposed over the top surface of the first dielectric layer 120. The metal charge control layer 128 is disposed laterally between the first metal contact 124 and the second metal contact 126. The metal charge control layer 128 is disposed over the active region of the semiconductor hetero-structure that forms, at least in part, the resistor. In some examples, the metal charge control layer 128 extends laterally over the semiconductor hetero-structure (e.g., in two lateral, perpendicular directions) to the extent permitted by a design rule. For example, in the illustrated cross-section, the metal charge control layer 128 extends laterally towards the first metal contact 124 as closely as permitted by a design minimum distance between metal features at that level of the structure, and extends laterally towards the second metal contact 126 as closely as permitted by the design minimum distance. The metal charge control layer 128 can laterally extend other distances, with differing coverage of the semiconductor hetero-structure, in other examples. Design rules can vary depending on a technology node of the semiconductor processing in some instances.

In some examples, the first metal contact 124, the second metal contact 126, and the metal charge control layer 128 can each be or include a conformal stack including (i) a sub-layer of titanium tungsten (TiW), (ii) a sub-layer of aluminum copper (AlCu), and (iii) a sub-layer of titanium nitride (TiN). Other metals and/or conductive materials may be implemented for the first metal contact 124, the second metal contact 126, and the metal charge control layer 128 in other examples.

A second dielectric layer 130 is disposed conformally over the first dielectric layer 120, the first metal contact 124, the second metal contact 126, and the metal charge control layer 128. The second dielectric layer 130 is disposed on a top surface of the first dielectric layer 120, on surfaces of the flange portions of the first metal contact 124 and second metal contact 126, and disposed along sidewall surfaces and on a top surface of the metal charge control layer 128. In some examples, the second dielectric layer 130 can be an ultraviolet (UV) blocking layer. In some examples, the second dielectric layer 130 is or include a silicon nitride, and in other examples, the second dielectric layer 130 can be or include another dielectric material.

A third dielectric layer 140 is disposed over the second dielectric layer 130. The third dielectric layer 140 has a substantially planar top surface (e.g., a surface distal from the semiconductor substrate 102). In some examples, the third dielectric layer 140 is or includes a doped silicon nitride (e.g., a p-doped silicon nitride), and in other examples, the third dielectric layer 140 can be or include another dielectric material.

Metal vias 144, 146 extend through the third dielectric layer 140 and the second dielectric layer 130 and contact the first metal contact 124 and second metal contact 126, respectively. The metal vias 144, 146 are disposed in and fill respective openings through the third dielectric layer 140 and the second dielectric layer 130. The metal vias 144, 146 may further be disposed in and fill remaining unfilled portions of openings in which the first metal contact 124 and second metal contact 126 are disposed. Metal lines 154, 156 are disposed over the metal vias 144, 146, respectively. In the illustrated example, the metal lines 154, 156 are integral with the respective metal vias 144, 146. The metal lines 154, 156 are further disposed over the top surface of the third dielectric layer 140. In other examples, the metal lines 154, 156 may be disposed embedded in the third dielectric layer 140. The metal lines 154, 156 are at a level in the semiconductor device structure 100 that may be referred to as a Metal 1 Layer.

In some examples, the metal charge control layer 128 is a floating electrical node, and in other examples, the metal charge control layer 128 is electrically connected to other circuitry that control a voltage of the metal charge control layer 128. In some examples where the metal charge control layer 128 is floating, no via or other conductive feature electrically connects to the metal charge control layer 128. In such examples, the metal charge control layer 128 may be isolated from other metal or conductive features, such as by the first dielectric layer 120 and the second dielectric layer 130.

In some examples where the metal charge control layer 128 is electrically connected to other circuitry, a metal via 148 (as shown in phantom) extends through the third dielectric layer 140 and the second dielectric layer 130 and contacts the metal charge control layer 128. A metal line 158 (as shown in phantom) is disposed over the metal via 148. The metal line 158 may be integral with the metal via 148. The metal line 158 is further disposed over the top surface of the third dielectric layer 140. In other examples, the metal line 158 may be disposed embedded in the third dielectric layer 140. The metal line 158 is at a same level in the semiconductor device structure 100 as the metal lines 154, 156, which may be referred to as the Metal 1 Layer.

In some examples, the metal via 144 and metal line 154, the metal via 146 and metal line 156, and if present, the metal via 148 and metal line 158 can be or include a stack including (i) a sub-layer of titanium tungsten (TiW), (ii) a fill of aluminum copper (AlCu), and (iii) a sub-layer of titanium nitride (TiN). Other metals and/or conductive materials may be implemented for the metal vias 144, 146, 148 and metal lines 154, 156, 158 in other examples.

A fourth dielectric layer 160 is disposed over the third dielectric layer 140 and the metal lines 154, 156, 158. The fourth dielectric layer 160 has a substantially planar top surface (e.g., a surface distal from the semiconductor substrate 102). In some examples, the fourth dielectric layer 160 is or includes silicon nitride (SiN), and in other examples, the fourth dielectric layer 160 can be or include another dielectric material.

Metal vias 164, 166 extend through the fourth dielectric layer 160 and contact the metal lines 154, 156, respectively. The metal vias 164, 166 are disposed in and fill respective openings through the fourth dielectric layer 160. Metal lines 174, 176 are disposed over the metal vias 164, 166, respectively. In the illustrated example, the metal lines 174, 176 are integral with the respective metal vias 164, 166. The metal lines 174, 176 are further disposed over the top surface of the fourth dielectric layer 160. In other examples, the metal lines 174, 176 may be disposed embedded in the fourth dielectric layer 160. The metal lines 174, 176 are at a level in the semiconductor device structure 100 that may be referred to as a Metal 2 Layer.

In some examples where the metal charge control layer 128 is electrically connected to other circuitry, a metal via 168 (as shown in phantom) extends through the fourth dielectric layer 160 and contacts the metal line 158. A metal line 178 (as shown in phantom) is disposed over the metal via 168. The metal line 178 may be integral with the metal via 168. The metal line 178 is further disposed over the top surface of the fourth dielectric layer 160. In other examples, the metal line 178 may be disposed embedded in the fourth dielectric layer 160. The metal line 178 is at a same level in the semiconductor device structure 100 as the metal lines 174, 176, which may be referred to as the Metal 2 Layer.

In some examples, the metal via 164 and metal line 174, the metal via 166 and metal line 176, and if present, the metal via 168 and metal line 178 can be or include a stack including (i) a sub-layer of titanium tungsten (TiW), (ii) a fill of aluminum copper (AlCu), and (iii) a sub-layer of titanium nitride (TiN). Other metals and/or conductive materials may be implemented for the metal vias 164, 166, 168 and metal lines 174, 176, 178 in other examples.

A fifth dielectric layer 180 is disposed over the fourth dielectric layer 160 and the metal lines 174, 176, 178. The fourth dielectric layer 160 has a substantially planar top surface (e.g., a surface distal from the semiconductor substrate 102). In some examples, the fifth dielectric layer 180 is or includes silicon nitride (SiN), silicon oxide (e.g., tetraethyl orthosilicate (TEOS)), the like, or a combination thereof, and in other examples, the fourth dielectric layer 160 can be or include another dielectric material.

Additional dielectric layers and metal layers may be included in the semiconductor device structure 100. The semiconductor device structure 100 is illustrated for simplicity and can include additional components or features.

Figure 2:
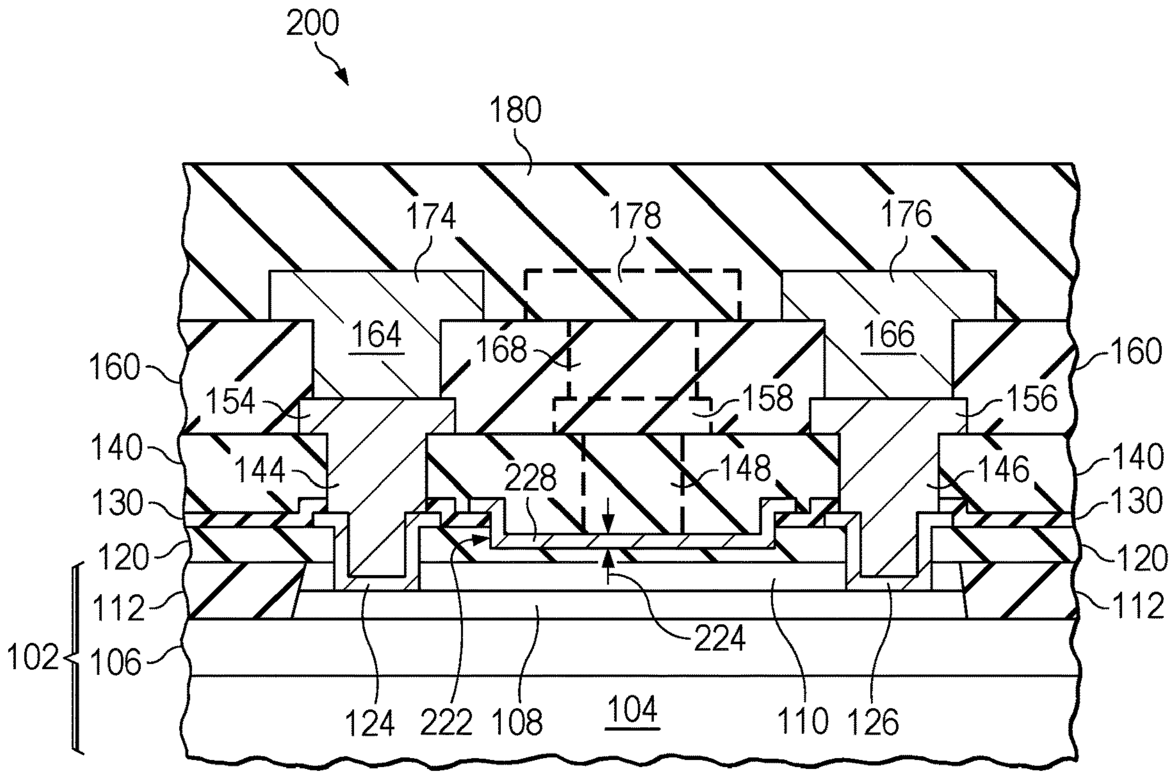
FIG. 2 is a cross-sectional view of a second semiconductor device structure according to some examples.

FIG. 2 is a cross-sectional view of a semiconductor device structure 200 according to some examples. The semiconductor device structure 200 may further be included in an integrated circuit. More specifically, the semiconductor device structure 200, in some examples, is a resistor structure. The resistor structure may be a 2DEG resistor structure. A 2DEG resistor structure can be implemented by a number of different configurations. The semiconductor device structure 200 of FIG. 2 is similar to the semiconductor device structure 100 of FIG. 1, and hence, like components are numbered in the figures the same. Description of such components is omitted here with reference to FIG. 2.

In FIG. 2, the second dielectric layer 130 is disposed conformally over the first dielectric layer 120, the first metal contact 124, and the second metal contact 126. The second dielectric layer 130 is disposed on a top surface of the first dielectric layer 120 and on surfaces of the flange portions of the first metal contact 124 and second metal contact 126. A recess 222 is formed through the second dielectric layer 130 and extends into the first dielectric layer 120. The recess 222 is disposed laterally between the first metal contact 124 and the second metal contact 126. The recess 222 does not extend completely through the first dielectric layer 120. A thickness 224 of the first dielectric layer 120 is disposed between a bottom surface of the recess 222 and a top surface of the hetero-structure (e.g., a top surface of the second epitaxial layer 110). The thickness 224 may be equal to or greater than about 0.07 μm.

A metal charge control layer 228, which is like the metal charge control layer 128 of FIG. 1, is disposed at least partially in the recess 222. In the illustrated example, the metal charge control layer 228 is conformal and extends laterally out of the recess and over the top surface of the second dielectric layer 130. The metal charge control layer 228 is disposed over the active region of the semiconductor hetero-structure that forms, at least in part, the resistor. In some examples, the metal charge control layer 228 extends laterally over the semiconductor hetero-structure (e.g., in two lateral, perpendicular directions) to the extent permitted by a design rule. For example, in the illustrated cross-section, the metal charge control layer 228 extends laterally towards the first metal contact 124 and/or metal via 144 as closely as permitted by a design minimum distance, and extends laterally towards the second metal contact 126 and/or metal via 146 as closely as permitted by the design minimum distance. The metal charge control layer 228 can laterally extend other distances, with differing coverage of the semiconductor hetero-structure, in other examples.

In some examples, the metal charge control layer 228 can be or include a conformal stack including (i) a sub-layer of titanium nitride (TiN), (ii) a sub-layer of aluminum copper (AlCu), and (iii) a sub-layer of titanium nitride (TiN). In some examples, the metal charge control layer 228 can be or include a conformal stack including (i) a sub-layer of titanium nitride (TiN) and (ii) a sub-layer of titanium tungsten (TiW). In some examples, the metal charge control layer 228 can be or include a conformal layer of titanium tungsten (TiW). Other metals and/or conductive materials may be implemented for the first metal contact 124, the second metal contact 126, and the metal charge control layer 128 in other examples.

Like with respect to FIG. 1, the metal charge control layer 228 can be floating or electrically connected to other circuitry. In some examples where the metal charge control layer 228 is electrically connected to other circuitry, a metal via 148 (as shown in phantom) extends through the third dielectric layer 140 and contacts the metal charge control layer 228.

Figure 3:
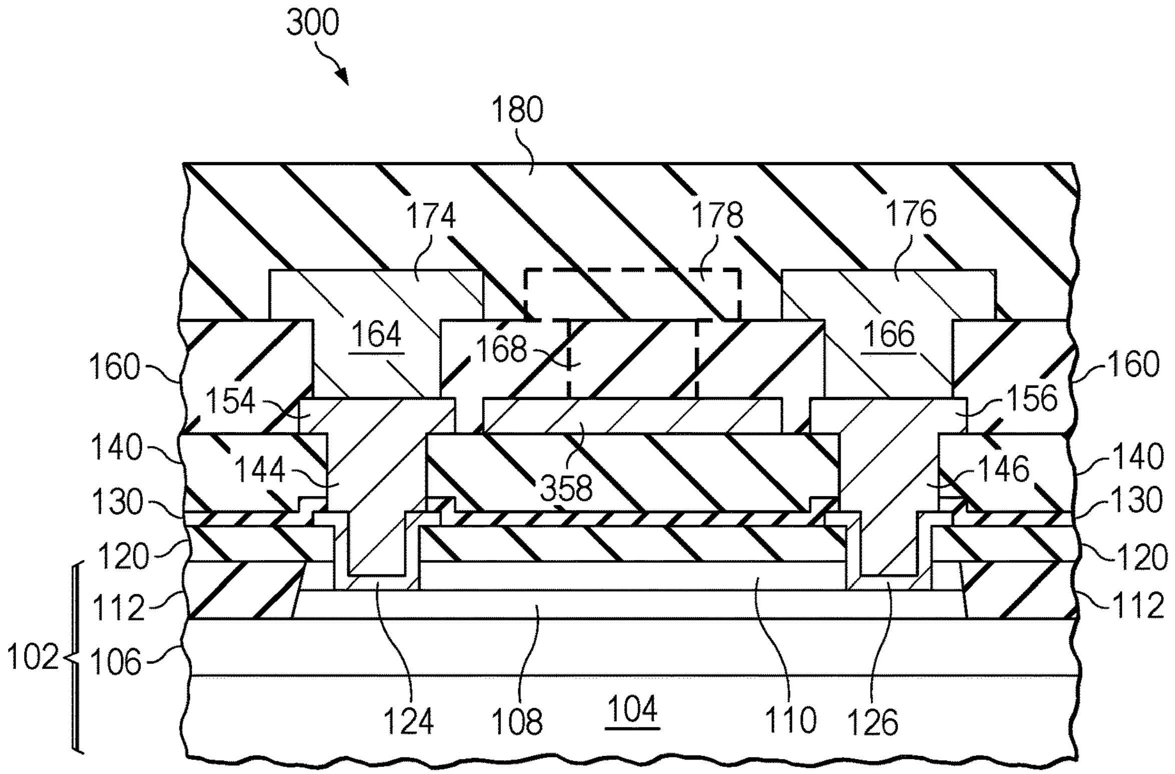
FIG. 3 is a cross-sectional view of a third semiconductor device structure according to some examples.

FIG. 3 is a cross-sectional view of a semiconductor device structure 300 according to some examples. The semiconductor device structure 300 may further be included in an integrated circuit. More specifically, the semiconductor device structure 300, in some examples, is a resistor structure. The resistor structure may be a 2DEG resistor structure. A 2DEG resistor structure can be implemented by a number of different configurations. The semiconductor device structure 300 of FIG. 3 is similar to the semiconductor device structure 100 of FIG. 1, and hence, like components are numbered in the figures the same. Description of such components is omitted here with reference to FIG. 3.

In FIG. 3, the second dielectric layer 130 is disposed conformally over the first dielectric layer 120, the first metal contact 124, and the second metal contact 126. The second dielectric layer 130 is disposed on a top surface of the first dielectric layer 120 and on surfaces of the flange portions of the first metal contact 124 and second metal contact 126. A metal charge control layer 358 is disposed over the top surface of the third dielectric layer 140. In this example, the metal charge control layer 358 is in the Metal 1 Layer with the metal lines 154, 156. The metal charge control layer 358 is disposed laterally between the metal lines 154, 156. The metal charge control layer 358 is disposed over the active region of the semiconductor hetero-structure that forms, at least in part, the resistor. In some examples, the metal charge control layer 358 extends laterally over the semiconductor hetero-structure (e.g., in two lateral, perpendicular directions) to the extent permitted by a design rule. For example, in the illustrated cross-section, the metal charge control layer 358 extends laterally towards the metal line 154 as closely as permitted by a design minimum distance between metal features in the Metal 1 Layer, and extends laterally towards the metal line 156 as closely as permitted by the design minimum distance. The metal charge control layer 358 can laterally extend other distances, with differing coverage of the semiconductor hetero-structure, in other examples. Like with respect to FIG. 1, the metal charge control layer 358 can be floating or electrically connected to other circuitry. In some examples where the metal charge control layer 358 is electrically connected to other circuitry, the metal via 168 (as shown in phantom) contacts the metal charge control layer 358.

Figure 4:
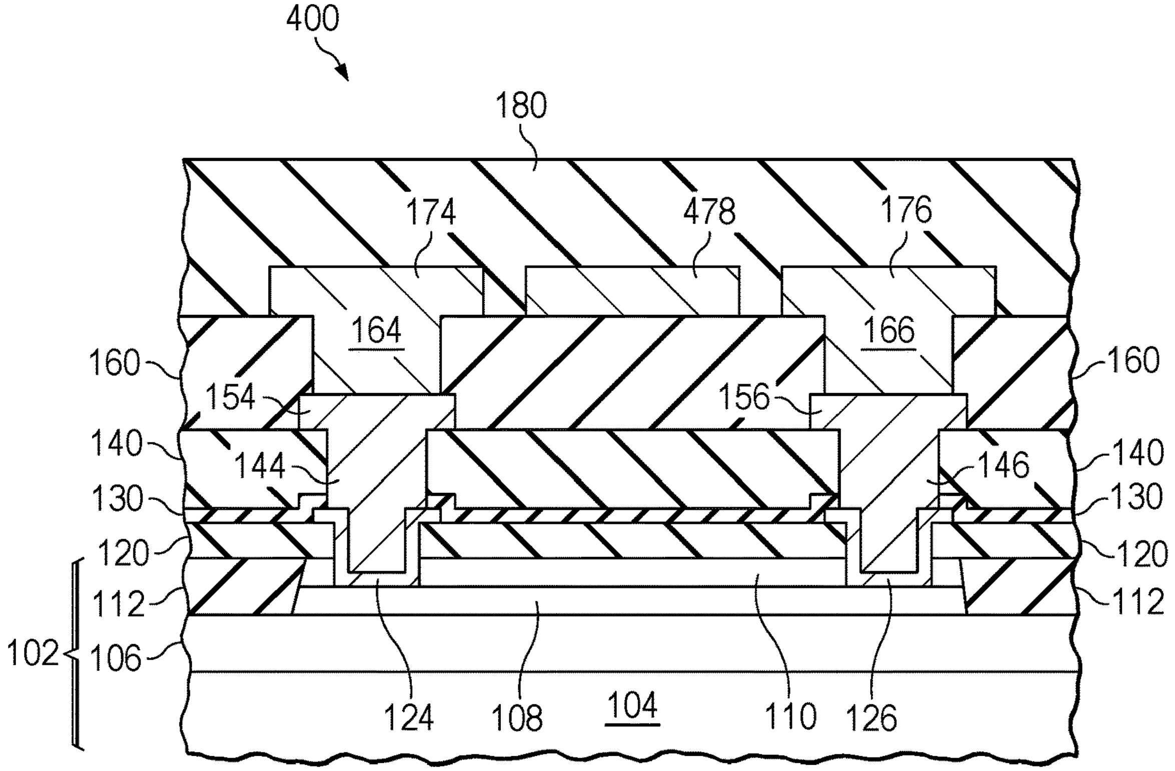
FIG. 4 is a cross-sectional view of a fourth semiconductor device structure according to some examples.

FIG. 4 is a cross-sectional view of a semiconductor device structure 400 according to some examples. The semiconductor device structure 400 may further be included in an integrated circuit. More specifically, the semiconductor device structure 400, in some examples, is a resistor structure. The resistor structure may be a 2DEG resistor structure. A 2DEG resistor structure can be implemented by a number of different configurations. The semiconductor device structure 400 of FIG. 4 is similar to the semiconductor device structure 100 of FIG. 1, and hence, like components are numbered in the figures the same. Description of such components is omitted here with reference to FIG. 4.

In FIG. 4, the second dielectric layer 130 is disposed conformally over the first dielectric layer 120, the first metal contact 124, and the second metal contact 126. The second dielectric layer 130 is disposed on a top surface of the first dielectric layer 120 and on surfaces of the flange portions of the first metal contact 124 and second metal contact 126. A metal charge control layer 478 is disposed over the top surface of the fourth dielectric layer 160. In this example, the metal charge control layer 478 is in the Metal 2 Layer with the metal lines 174, 176. The metal charge control layer 478 is disposed laterally between the metal lines 174, 176. The metal charge control layer 478 is disposed over the active region of the semiconductor hetero-structure that forms, at least in part, the resistor. In some examples, the metal charge control layer 478 extends laterally over the semiconductor hetero-structure (e.g., in two lateral, perpendicular directions) to the extent permitted by a design rule. For example, in the illustrated cross-section, the metal charge control layer 478 extends laterally towards the metal line 174 as closely as permitted by a design minimum distance between metal features in the Metal 2 Layer, and extends laterally towards the metal line 176 as closely as permitted by the design minimum distance. The metal charge control layer 478 can laterally extend other distances, with differing coverage of the semiconductor hetero-structure, in other examples. Like with respect to FIG. 1, the metal charge control layer 478 can be floating or electrically connected to other circuitry. In some examples where the metal charge control layer 478 is electrically connected to other circuitry, the metal charge control layer 478 may be contacted through another via and/or metal layer.

As illustrated by the foregoing examples, a metal charge control layer may be disposed at any distance electrically isolated from the semiconductor hetero-structure. In semiconductor device structures including a Metal 3 Layer or more, for example, a metal charge control layer may be disposed in the Metal 3 Layer or higher consistent with the above description. However, a larger distance between a metal charge control layer and the semiconductor hetero-structure may diminish the effectiveness of the metal charge control layer.

In operation, the semiconductor device structures of FIGS. 1 through 4 can form a sheet channel in the first epitaxial layer 108 at the heterojunction between the first epitaxial layer 108 and the second epitaxial layer 110. The sheet channel may be a 2DEG sheet channel. The sheet channel is disposed between the first metal contact 124 and the second metal contact 126 and may form the resistor of a resistor structure. The metal charge control layer 128, 228, 358, 478 is contrasted with a gate in a transistor. Unlike a gate in a depletion-type transistor, in operation, the metal charge control layer 128, 228, 358, 478 does not control the charge density of a channel to fully deplete the channel or modulate the charge density of the channel. In some examples, a charge control layer may control the charge in the capping layer(s) of the 2DEG channel without impacting the charge density in the 2DEG channel. Generally, the metal charge control layer 128, 228, 358, 478 is not close enough to the hetero-structure to be capable of, e.g., fully depleting a sheet channel within an allowed voltage range that does not breakdown or cause damage to the capping layer(s). As illustrated by the thickness 224 in FIG. 2, and extended to FIGS. 1, 3, and 4, the metal charge control layer 128, 228, 358, 478 may be a distance of 0.07 μm or greater from the hetero-structure. Additionally, a gate in a depletion-type transistor generally is over a small portion of the 2DEG channel between the source and drain, whereas in some examples, the metal charge control layer may be over a much larger area across almost the entire 2DEG channel. In some examples, the metal charge control layer covers from about 50% to about 99% of the 2DEG channel, for example, about 95% of the 2DEG channel. In some examples, the metal charge control layer covers greater than about 80% and less than 100% of the 2DEG channel. The coverage of the 2DEG channel by the metal charge control layer may vary, for example, based on the aspect ratio (e.g., ratio of lateral width to lateral length) of the 2DEG channel.

In examples where the metal charge control layer 128, 228, 358, 478 is an electrically floating node, the metal charge control layer 128, 228, 358, 478 may serve as a sink for charges migrating in the dielectric layers 120, 130, 140, 160, 180 and can shield the hetero-structure from the charges. The distance between the metal charge control layer 128, 228, 358, 478 and the hetero-structure may reduce an electric field at the heterojunction (relative to if charges are accumulated on the first dielectric layer 120) such that depletion of surface donor states at the heterojunction can be reduced.

In examples where the metal charge control layer 128, 228, 358, 478 is electrically connected to other circuitry, the metal charge control layer 128, 228, 358, 478 may serve as a sink for charges migrating in the dielectric layers 120, 130, 140, 160, 180 and can drain the charges from the semiconductor device structure 100, 200, 300, 400. Additionally, the circuitry can apply a voltage to the metal charge control layer 128, 228, 358, 478 to control donor states at the heterojunction, e.g., by controlling the electric field (based on the applied voltage) at the heterojunction. In some examples, the circuitry electrically connects the metal charge control layer 128, 228, 358, 478 to a ground node, whereby charge is drained to the ground node. In some examples, the circuitry can include a feedback loop to dynamically control a voltage applied to the metal charge control layer 128, 228, 358, 478. For example, the feedback loop can include circuitry to determine the voltage across the resistor (e.g., between the first metal contact 124 and the second metal contact 126) and the current through the resistor. Based on the detected voltage and current, control logic, a controller, or the like can determine the resistance of the resistor, and based on that determined resistance, can output a voltage to the metal charge control layer 128, 228, 358, 478 to control the charge donor state of the heterojunction, and hence, the resistance of the resistor.

Figure 5:
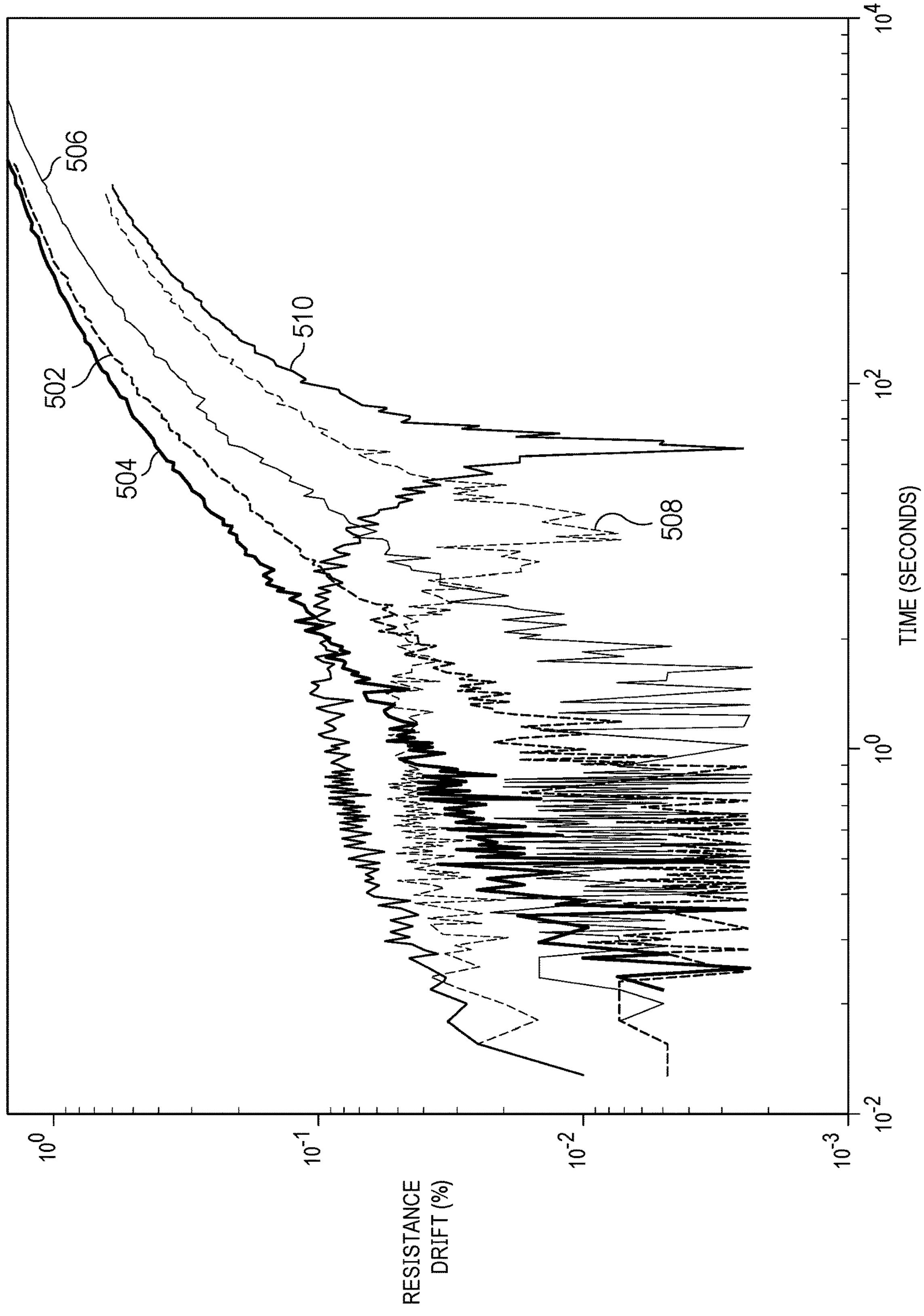
FIG. 5 is a chart illustrating resistance drift of an example resistor structure as a function of time according to some examples.

FIG. 5 is a chart illustrating resistance drift (as a percentage of resistance) of an example resistor structure as a function of time, where the resistor structure includes a metal charge control layer. In different simulations, different voltages were applied to the metal charge control layer, or the metal charge control layer was electrically floating. Curve 502 shows the simulated resistance drift over time when the metal charge control layer is electrically floating. Curve 504 shows the simulated resistance drift over time when +2 V is applied to the metal charge control layer. Curve 506 shows the simulated resistance drift over time when the metal charge control layer is grounded (e.g., 0 V applied). Curve 508 shows the simulated resistance drift over time when −2 V is applied to the metal charge control layer. Curve 510 shows the simulated resistance drift over time when −4 V is applied to the metal charge control layer.

Figure 6:
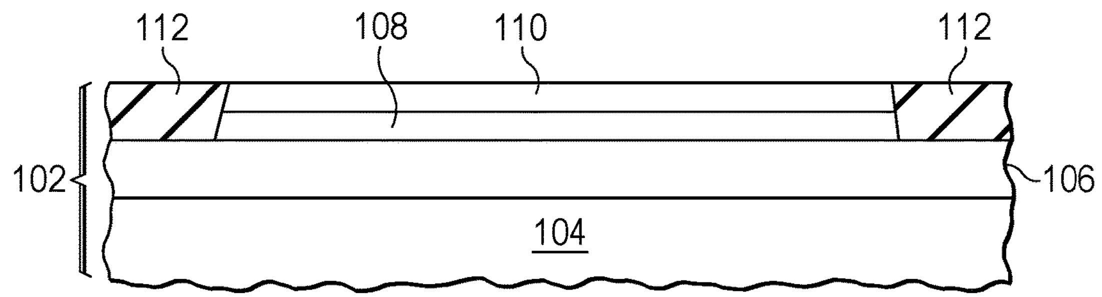
FIGS. 6 through 12 are cross-sectional views of intermediate semiconductor device structures during a method of semiconductor processing according to some examples.

FIGS. 6 through 12 illustrate cross-sectional views of intermediate semiconductor device structures during a method of semiconductor processing to form the semiconductor device structure 100 of FIG. 1. Referring to FIG. 6, a semiconductor substrate 102 including a semiconductor hetero-structure is provided. In the illustrated example, providing the semiconductor substrate 102 includes epitaxially growing a buffer structure 106 on a support substrate 104. A first epitaxial layer 108 is epitaxially grown on the buffer structure 106, and a second epitaxial layer 110 is epitaxially grown on the first epitaxial layer 108. The epitaxial growth of any of the buffer structure 106, first epitaxial layer 108, and second epitaxial layer 110 can be performed by using any appropriate epitaxial growth process, such as low pressure chemical vapor deposition (LPCVD) or the like.

Further, the isolation regions 112 are formed in the semiconductor substrate 102. A photoresist is deposited on the semiconductor substrate 102 and patterned to expose regions of the semiconductor substrate 102 corresponding to where the isolation regions 112 are to be formed. Once the photoresist is patterned, an amorphizing implantation is performed, such as by implanting argon (Ar), to amorphize the first epitaxial layer 108 and second epitaxial layer 110. The amorphized regions form the isolation regions 112. The isolation regions 112 can be formed to other depths. The isolation regions 112 can be formed by other processes, such as by an STI process, DTI process, or the like.

Although not illustrated in the figures, if, for example, a high electron mobility transistor (HEMT) is to be formed in a different region of the semiconductor substrate 102, a third epitaxial layer (e.g., p-doped gallium nitride) is epitaxially grown on the second epitaxial layer 110 after the isolation regions 112 are formed. In the region of the semiconductor substrate 102 in which the resistor structure is to be formed, the third epitaxial layer is removed, such as by using photolithography and etch processes.

Figure 7:
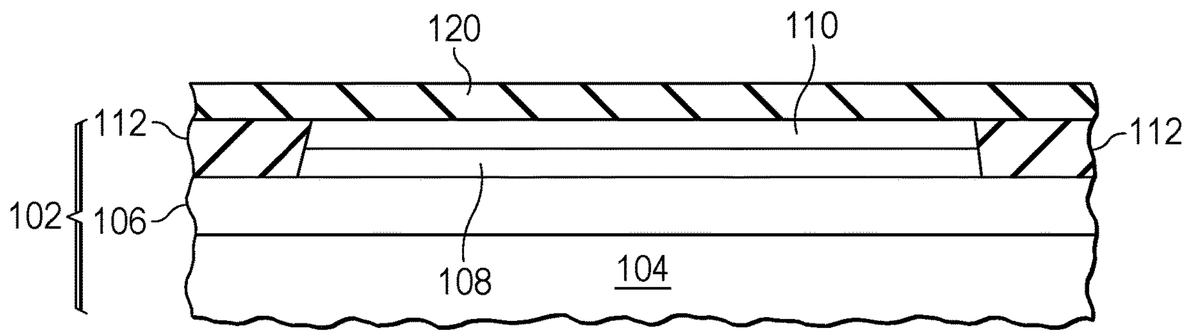

Referring to FIG. 7, a first dielectric layer 120 is formed on the semiconductor substrate 102. The first dielectric layer 120 can be formed using any appropriate deposition, such as a chemical vapor deposition (CVD), and more particularly, plasma enhanced CVD (PECVD).

Figure 8:
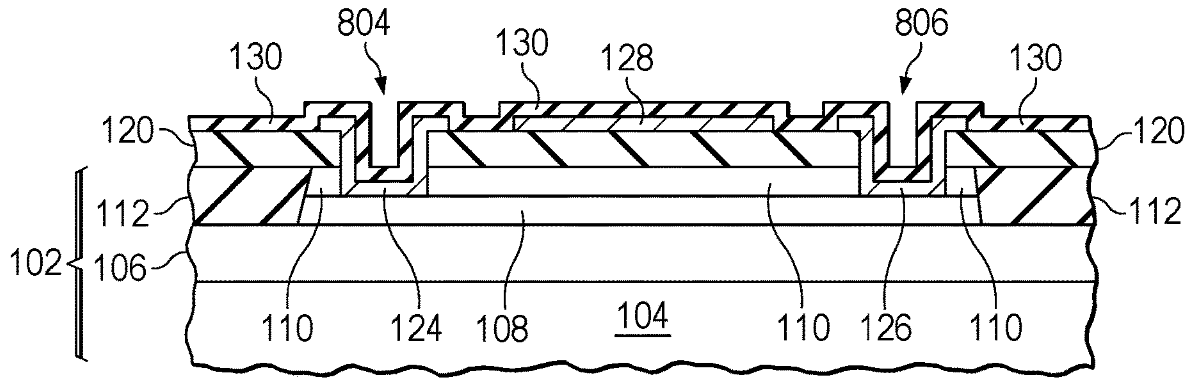

Referring to FIG. 8, openings 804, 806 are formed through the first dielectric layer 120 and the second epitaxial layer 110 to the first epitaxial layer 108. The openings 804, 806 can be formed using photolithography and etch processes. The first metal contact 124 and second metal contact 126 are formed disposed at least partially in the openings 804, 806, respectively, and the metal charge control layer 128 is formed over the first dielectric layer 120. In some examples, a layer (or multiple sub-layers) of a metal is conformally deposited over the top surface of the first dielectric layer 120 and along surfaces of the openings 804, 806. The deposition of the layer (or sub-layers) of metal can be performed using CVD, atomic layer deposition (ALD), the like, or a combination thereof. Photolithography and etch processes are performed to pattern the layer (or sub-layers) of the metal into the first metal contact 124, second metal contact 126, and metal charge control layer 128.

A second dielectric layer 130 is formed conformally over the first dielectric layer 120, first metal contact 124, second metal contact 126, and metal charge control layer 128. As deposited, the second dielectric layer 130 is disposed along exposed surfaces of the first metal contact 124 and the second metal contact 126 that are in the openings 804, 806. The second dielectric layer 130 can be deposited using PECVD or another deposition process. After the second dielectric layer 130 has been formed, an anneal process can be performed to reduce resistance at an interface between the first metal contact 124 and the first epitaxial layer 108 and at an interface between the second metal contact 126 and the first epitaxial layer 108. The anneal may be performed at about 800° C. for about 30 seconds in a nitrogen ($N_2$) environment.

In some examples, a gate formation process may be performed, such as when a HEMT is to be formed in a different region of the semiconductor substrate 102. The gate formation process may form a gate structure for the HEMT. Details of a gate formation process are described with respect to subsequent figures and examples.

Figure 9:
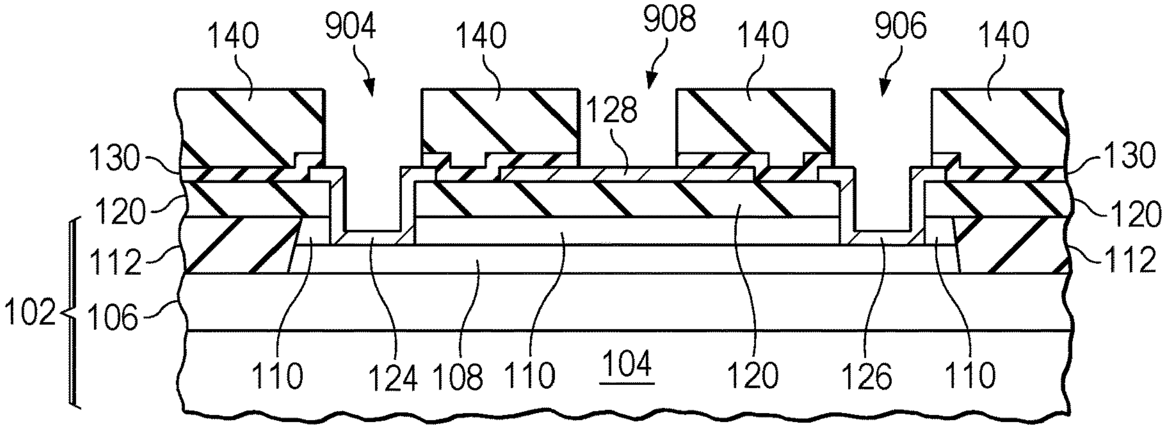

Referring to FIG. 9, a third dielectric layer 140 is formed over the second dielectric layer 130. The third dielectric layer 140 may be deposited using PECVD or another deposition process. Then, openings 904, 906 are formed through the third dielectric layer 140 and the second dielectric layer 130. The opening 904 through the third dielectric layer 140 and the second dielectric layer 130 exposes the first metal contact 124, and the opening 906 through the third dielectric layer 140 and the second dielectric layer 130 exposes the second metal contact 126. The openings 904, 906 can be formed using photolithography and etch processes.

As stated previously, the metal charge control layer 128 is electrically connected to other circuitry in some examples. In such examples, as illustrated, an opening 908 can be formed through the third dielectric layer 140 and the second dielectric layer 130 to expose the metal charge control layer 128. The opening 908 can be formed simultaneously with the formation of the openings 904, 906.

As also stated previously, the metal charge control layer 128 is an electrically floating node in some examples. In such examples, the formation of the opening 908 illustrated in FIG. 9 can be omitted, such as by altering a mask used in the photolithography to form the openings 904, 906. Hence, any metal that would be deposited in the opening 908 (as subsequently described) would likewise be omitted in such examples. The following figures and corresponding description illustrates an example in which the opening 908 is implemented for electrically connecting the metal charge control layer 128 to other circuitry. Features that would be omitted from a structure when the opening 908 is omitted are apparent, particularly in view of the above description of FIG. 1.

Figure 10:
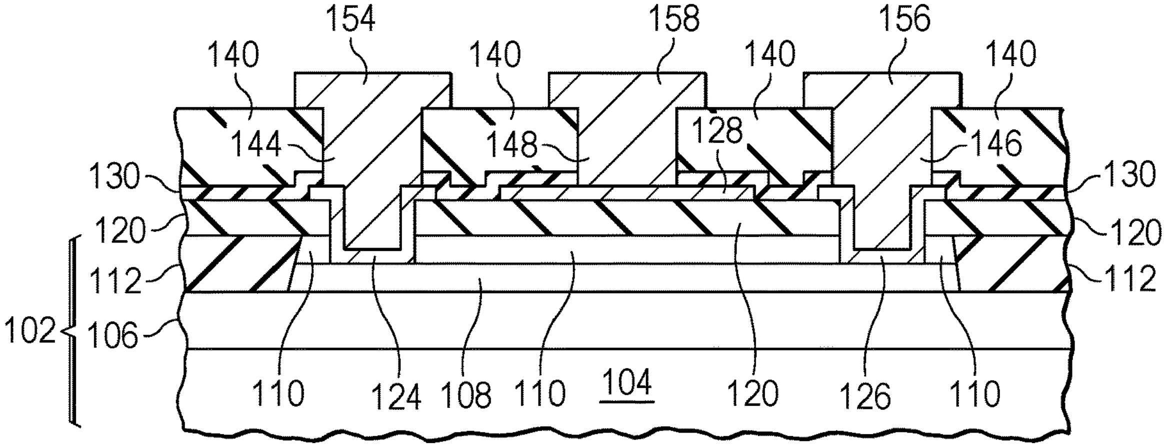

Referring to FIG. 10, metal vias 144, 146, 148 and metal lines 154, 156, 158 are formed. The metal vias 144, 146, 148 are disposed in the openings 904, 906, 908, respectively. The metal via 144 contacts the first metal contact 124. The metal via 146 contacts the second metal contact 126. The metal via 148 contacts the metal charge control layer 128. The metal lines 154, 156, 158 are formed over the metal vias 144, 146, 148, respectively. In the illustrated example, the metal lines 154, 156, 158 are formed integral with the metal vias 144, 146, 148, respectively. The metal vias 144, 146, 148 and metal lines 154, 156, 158 can be formed by depositing a metal or multiple metals in the openings 904, 906, 908 and to a thickness over the third dielectric layer 140 and subsequently patterning the metal(s) into the metal lines 154, 156, 158 with the metal vias 144, 146, 148 thereunder. The deposition can be by CVD, physical vapor deposition (PVD), the like, or a combination thereof. The metal(s) can be patterned using photolithography and etch processes. The metal vias 144, 146, 148 and metal lines 154, 156, 158 can be formed using other processes, such as a dual damascene process.

Figure 11:
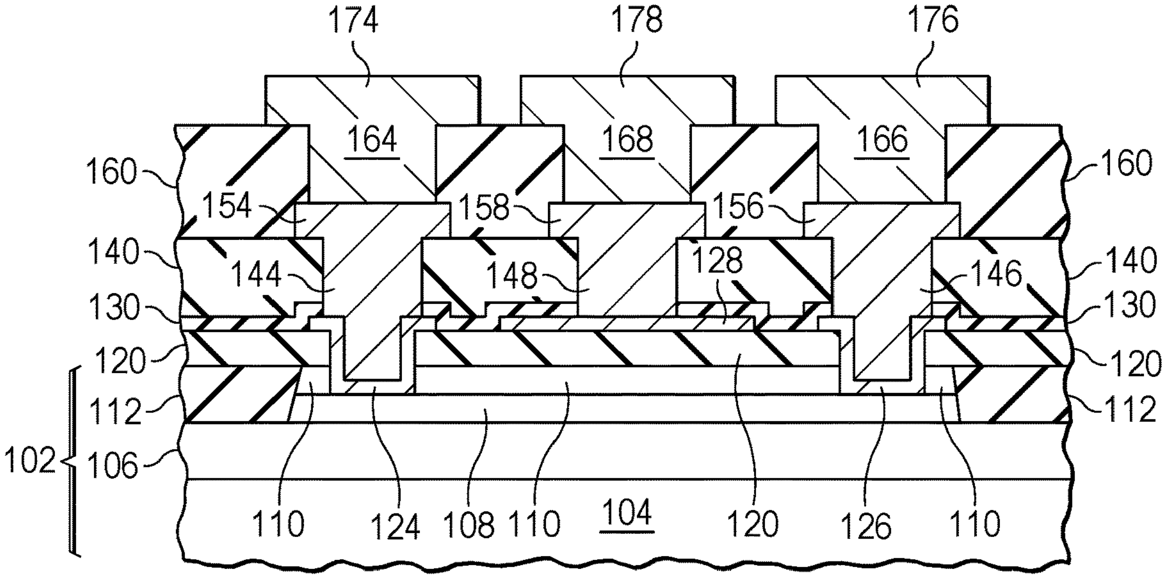

Referring to FIG. 11, a fourth dielectric layer 160, metal vias 164, 166, 168, and metal lines 174, 176, 178 are formed. The fourth dielectric layer 160 is formed over the third dielectric layer 140 and the metal lines 154, 156, 158. Openings (not specifically referenced in FIG. 11) are then formed through the fourth dielectric layer 160 to expose the metal lines 174, 176, 178. The metal vias 164, 166, 168 are disposed in the openings. The metal via 164 contacts the metal line 154. The metal via 166 contacts the metal line 156. The metal via 168 contacts the metal line 158. The metal lines 174, 176, 178 are formed over the metal vias 164, 166, 168, respectively. In the illustrated example, the metal lines 174, 176, 178 are formed integral with the metal vias 164, 166, 168, respectively. The processes for forming the fourth dielectric layer 160, metal vias 164, 166, 168, and metal lines 174, 176, 178 can be like described above with respect to FIGS. 9 and 10.

Figure 12:
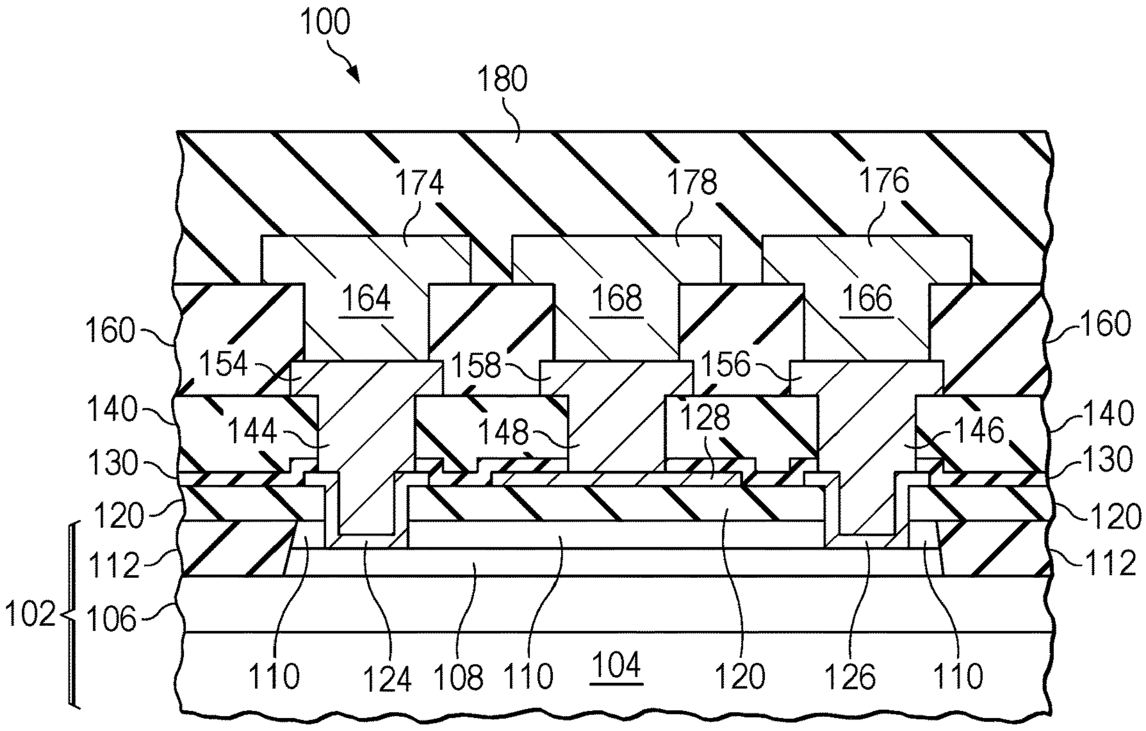

Referring to FIG. 12, a fifth dielectric layer 180 is formed over the fourth dielectric layer 160 and the metal lines 174, 176, 178. The fifth dielectric layer 180 can be deposited by PECVD or another deposition process. Additional metal layers and corresponding metal vias may be formed in and/or over the fifth dielectric layer 180.

FIGS. 13 through 16 illustrate cross-sectional views of intermediate semiconductor device structures during a method of semiconductor processing to form the semiconductor device structure 200 of FIG. 2. The method begins by performing processing described above with respect to FIGS. 6 and 7 to provide a semiconductor substrate 102 including a semiconductor hetero-structure and to form a first dielectric layer 120 on the semiconductor substrate 102.

Figure 13:
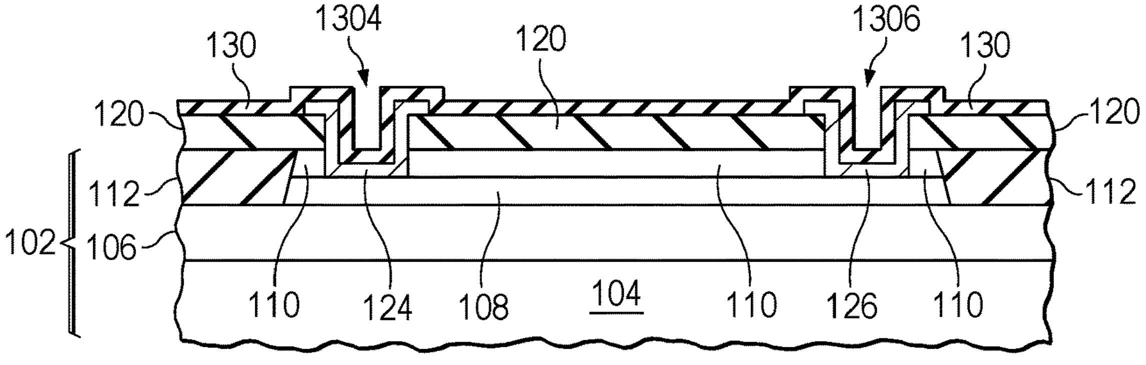
FIGS. 13 through 16 are cross-sectional views of intermediate semiconductor device structures during another method of semiconductor processing according to some examples.

Referring to FIG. 13, openings 1304, 1306 are formed through the first dielectric layer 120 and the second epitaxial layer 110 to the first epitaxial layer 108. The openings 1304, 1306 can be formed using photolithography and etch processes. The first metal contact 124 and second metal contact 126 are formed disposed at least partially in the openings 1304, 1306, respectively. In some examples, a layer (or multiple sub-layers) of a metal is conformally deposited over the top surface of the first dielectric layer 120 and along surfaces of the openings 1304, 1306. The deposition of the layer (or sub-layers) of metal can be performed using CVD, ALD, the like, or a combination thereof. Photolithography and etch processes are performed to pattern the layer (or sub-layers) of the metal into the first metal contact 124 and second metal contact 126.

A second dielectric layer 130 is formed conformally over the first dielectric layer 120, first metal contact 124, and second metal contact 126. As deposited, the second dielectric layer 130 is disposed along exposed surfaces of the first metal contact 124 and the second metal contact 126 that are in the openings 1304, 1306. The second dielectric layer 130 can be deposited using PECVD or another deposition process.

Figure 14:
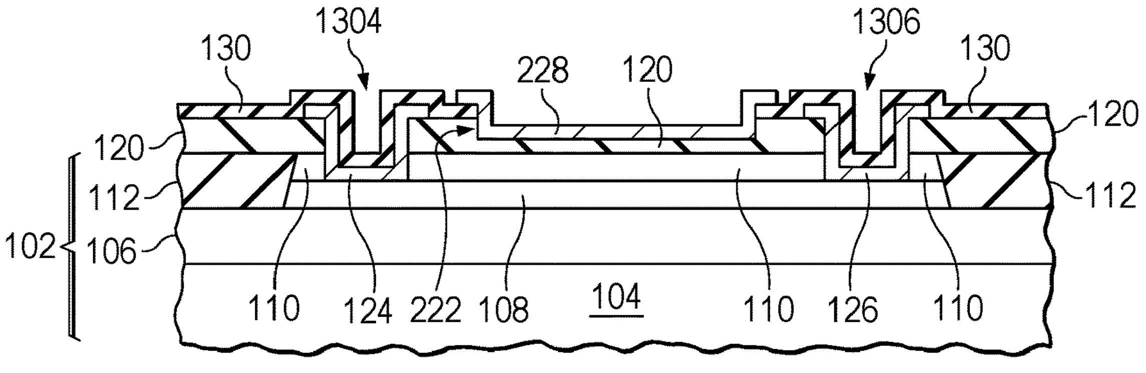

Referring to FIG. 14, a recess 222 is formed in the first dielectric layer 120 and through the second dielectric layer 130, and a metal charge control layer 228 is formed at least partially disposed in the recess 222. The recess 222 extends through the second dielectric layer 130 and into the first dielectric layer 120. The recess 222, in the illustrated example, is not through the first dielectric layer 120 and does not expose the semiconductor hetero-structure (e.g., the second epitaxial layer 110). Hence, a bottom surface of the recess 222 is a surface of the first dielectric layer 120. The recess 222 can be formed using photolithography and etch processes. After the recess 222 has been formed, an anneal process can be performed to reduce resistance at an interface between the first metal contact 124 and the first epitaxial layer 108 and at an interface between the second metal contact 126 and the first epitaxial layer 108. The anneal may be performed at about 800° C. for about 30 seconds in a nitrogen ($N_2$) environment.

In some examples, to form the metal charge control layer 228, a layer (or multiple sub-layers) of a metal is conformally deposited over the top surface of the second dielectric layer 130 and along surfaces of the recess 222. The deposition of the layer (or sub-layers) of metal can be performed using CVD, ALD, the like, or a combination thereof. Photolithography and etch processes are performed to pattern the layer (or sub-layers) of the metal into the metal charge control layer 228. As illustrated, the metal charge control layer 228 is disposed at least partially in the recess 222. Further, the metal charge control layer 228 is illustrated as being conformal along sidewall surfaces of the recess 222 and over a portion of the top surface of the second dielectric layer 130. In other examples, the metal charge control layer 228 can have other configurations, such as filling the recess 222, not being conformal along sidewalls surfaces of the recess 222, and/or not being over the top surface of the second dielectric layer 130.

The processing described with respect to FIG. 14 may simultaneously form a metal gate for a HEMT, which is formed in a different region of the semiconductor substrate 102. Hence, the processing of FIG. 14 may be described as a gate formation process. In the context of a HEMT, the etch process (which forms the recess 222 in FIG. 14) may expose a third epitaxial layer that is formed in the region for the HEMT. In the context of the semiconductor device structure 200 (e.g., resistor structure) to be formed, no epitaxial layer in the region of the semiconductor substrate 102 where the semiconductor device structure 200 is to be formed is exposed by the etch process. Hence, in the semiconductor device structure 200, at least a portion of the first dielectric layer 120 remains disposed between the metal charge control layer 228 and the second epitaxial layer 110, whereas in a HEMT, the metal gate may adjoin and contact a third epitaxial layer.

Figure 15:
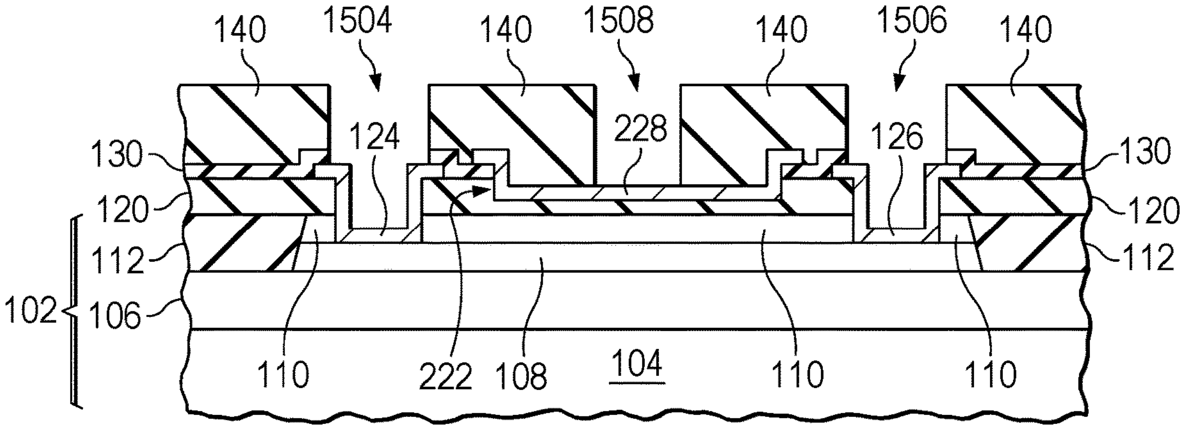

Referring to FIG. 15, the third dielectric layer 140 is formed over the second dielectric layer 130, like described with respect to FIG. 9. Then, openings 1504, 1506 are formed through the third dielectric layer 140 and the second dielectric layer 130. The opening 1504 through the third dielectric layer 140 and the second dielectric layer 130 exposes the first metal contact 124, and the opening 1506 through the third dielectric layer 140 and the second dielectric layer 130 exposes the second metal contact 126. The openings 1504, 1506 can be formed using photolithography and etch processes.

As stated previously, the metal charge control layer 228 is electrically connected to other circuitry in some examples. In such examples, as illustrated, an opening 1508 can be formed through the third dielectric layer 140 to expose the metal charge control layer 228. The opening 1508 can be formed simultaneously with the formation of the openings 1504, 1506.

As also stated previously, the metal charge control layer 228 is an electrically floating node in some examples. In such examples, the formation of the opening 1508 illustrated in FIG. 15 can be omitted. Hence, any metal that would be deposited in the opening 1508 (as subsequently described) would likewise be omitted in such examples. The following figures and corresponding description illustrates an example in which the opening 1508 is implemented for electrically connecting the metal charge control layer 228 to other circuitry. Features that would be omitted from a structure when the opening 1508 is omitted are apparent, particularly in view of the above description of FIG. 2.

Figure 16:
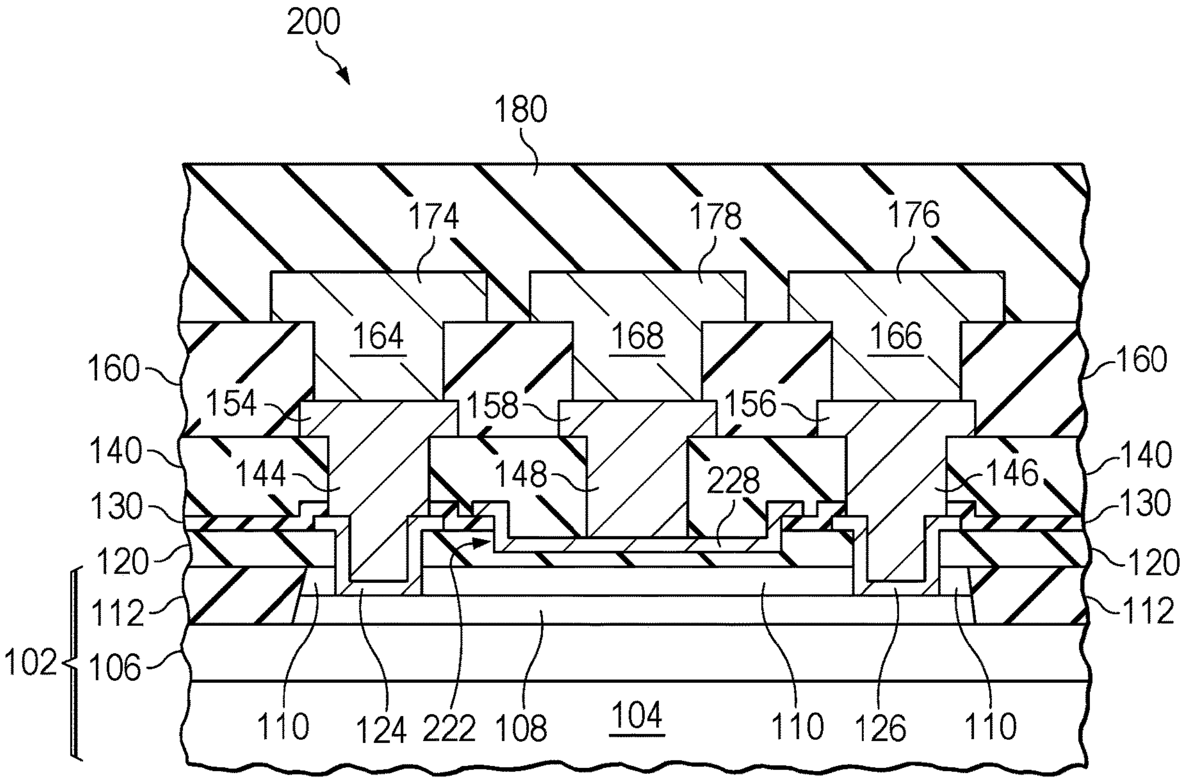

Referring to FIG. 16, metal vias 144, 146, 148 and metal lines 154, 156, 158 are formed, as described above with respect to FIG. 10. A fourth dielectric layer 160, metal vias 164, 166, 168, and metal lines 174, 176, 178 are formed, as described with respect to FIG. 11. A fifth dielectric layer 180 is formed, as described above with respect to FIG. 12. Additional metal layers and corresponding metal vias may be formed in and/or over the fifth dielectric layer 180.

Although not specifically illustrated in figures, another example is a method of semiconductor processing to form the semiconductor device structure 300 of FIG. 3. The method is as described above with respect to FIGS. 6 through 12, except that the metal charge control layer 128 is omitted and the metal charge control layer 358 is formed. The metal charge control layer 128 can be omitted by altering the mask of the photolithography used for patterning with respect to FIG. 8. The metal charge control layer 358 can be formed by omitting the opening 908 in FIG. 9 and by altering the mask of the photolithography used for patterning the Metal 1 Layer with respect to FIG. 10.

Similarly, although not specifically illustrated in figures, another example is a method of semiconductor processing to form the semiconductor device structure 400 of FIG. 4. The method is as described above with respect to FIGS. 6 through 12, except that the metal charge control layer 128 is omitted and the metal charge control layer 478 is formed. The metal charge control layer 128 can be omitted by altering the mask of the photolithography used for patterning with respect to FIG. 8. The metal charge control layer 478 can be formed by omitting the opening 908 in FIG. 9, and by altering the respective masks of the photolithography used for patterning the Metal 1 Layer with respect to FIG. 10 (e.g., to omit metal line 158) and the Metal 2 Layer with respect to FIG. 11 (e.g., to include the metal charge control layer 478). Similar modifications may be made to include a charge control layer in another metal layer.

Although various examples have been described in detail, it should be understood that various changes, substitutions, and alterations can be made therein without departing from the scope defined by the appended claims.

What is claimed is:

1. A semiconductor device, comprising:

a semiconductor substrate comprising a semiconductor hetero-structure;

a first dielectric layer disposed over the semiconductor substrate;

a first contact disposed through the first dielectric layer and contacting the semiconductor hetero-structure;

a second contact disposed through the first dielectric layer and contacting the semiconductor hetero-structure, the second contact being disposed laterally separated from the first contact;

a second dielectric layer disposed over at least portions of the first contact, the second contact, and the first dielectric layer, the second dielectric layer including silicon nitride;

a third dielectric layer disposed between the portion of first dielectric layer and the second dielectric layer such that the first and third dielectric layers physically contact each other and the second and third dielectric layers physically contact each other, wherein the third dielectric layer is an ultraviolet blocking layer and has a different material composition than the first and second dielectric layers; and a charge control layer disposed over the semiconductor hetero-structure and laterally between the first contact and the second contact, at least the portion of the first dielectric layer being disposed between the charge control layer and the semiconductor hetero-structure, wherein the charge control layer includes a same material as the first contact.

2. The semiconductor device of claim 1, wherein the charge control layer is an electrically isolated node.

3. The semiconductor device of claim 1, wherein the charge control layer is electrically connected to circuitry on the semiconductor substrate, the circuitry being configured to control a voltage of the charge control layer.

4. The semiconductor device of claim 1, wherein the charge control layer is disposed at least partially in a recess disposed in the first dielectric layer, the recess extending from a top surface of the first dielectric layer, the top surface of the first dielectric layer being a surface distal from the semiconductor substrate.

5. The semiconductor device of claim 1, wherein the semiconductor hetero-structure forms at least a portion of a two-dimensional electron gas (2DEG) resistor.

6. The semiconductor device of claim 1, wherein a two-dimensional electron gas (2DEG) channel is disposed in the semiconductor hetero-structure and laterally between the first contact and the second contact, the charge control layer covering from 50% to 99% of the 2DEG channel.

7. The semiconductor device of claim 1, wherein the charge control layer is disposed over the second dielectric layer.

8. The semiconductor device of claim 1, wherein:

the charge control layer is disposed over a metal layer, the metal layer disposed over the second dielectric layer and further including a first metal line and a second metal line;

the charge control layer is disposed over the semiconductor hetero-structure and laterally between the first metal line and the second metal line;

the first metal line is connected to the first contact and the second metal line is connected to the second contact; and the charge control layer is disposed over the semiconductor hetero-structure without any other charge control layers disposed between the charge control layer and the semiconductor hetero-structure.

9. The semiconductor device of claim 1, wherein the charge control layer includes a first metal sublayer and a second metal sublayer, the first metal sublayer having a different material composition than the second metal sublayer.

10. The semiconductor device of claim 1, wherein the silicon nitride of the second dielectric layer is p-type doped.

11. The semiconductor device of claim 9, wherein:

the charge control layer further includes a third metal sublayer; and the third metal sublayer has a different material composition than the first metal sublayer and the second metal sublayer.

12. The semiconductor device of claim 11, wherein:

the first metal sublayer includes titanium tungsten (TiW);

the second metal sublayer includes aluminum copper (AlCu); and the third metal sublayer includes titanium nitride (TIN).

13. An integrated circuit comprising:

a resistor structure comprising:

a hetero-structure comprising an epitaxial layer disposed over a dissimilar semiconductor material;

a first contact disposed through a first dielectric layer over the hetero-structure, the first contact electrically contacting the dissimilar semiconductor material;

a second contact disposed through the first dielectric layer and laterally separate from the first contact, the second contact electrically contacting the dissimilar semiconductor material;

a second dielectric layer disposed over at least portions of the first contact, the second contact, and the first dielectric layer, the second dielectric layer including silicon nitride;

a third dielectric layer disposed between the portion of first dielectric layer and the second dielectric layer such that the first and third dielectric layers physically contact each other and the second and third dielectric layers physically contact each other, wherein the third dielectric layer is an ultraviolet blocking layer and has a different material composition than the first and second dielectric layers; and a charge control layer disposed over the hetero-structure and laterally between the first contact and the second contact, at least the portion of the first dielectric layer being disposed between the charge control layer and the hetero-structure, wherein the charge control layer includes a same material as the first contact.

14. The integrated circuit of claim 13, wherein the charge control layer is an electrically floating node.

15. The integrated circuit of claim 13, wherein the dissimilar semiconductor material and the epitaxial layer are not substantially doped.

16. The integrated circuit of claim 13, wherein:

the resistor structure is a two-dimensional electron gas (2DEG) resistor;

a 2DEG channel is disposed in the hetero-structure and laterally between the first contact and the second contact; and the charge control layer covers from 50% to 99% of the 2DEG channel.

17. The integrated circuit of claim 13, wherein the first contact is formed of the same material structure as the charge control layer.

18. The integrated circuit of claim 13, wherein the charge control layer physically contacts the second dielectric layer.

19. The integrated circuit of claim 13, wherein:

the third dielectric layer is disposed on the first contact, the second contact, the charge control layer and the first dielectric layer.

20. The integrated circuit of claim 19, wherein:

the second dielectric layer is disposed on at least the third dielectric layer; and at least the third dielectric layer prevents the second dielectric layer from physically contacting the charge control layer.

21. The integrated circuit of claim 13, wherein the charge control layer includes a first metal sublayer and a second metal sublayer, the first metal sublayer having a different material composition than the second metal sublayer.

22. The integrated circuit of claim 13, wherein the silicon nitride of the second dielectric layer is p-type doped.

23. The integrated circuit of claim 21, wherein:

the charge control layer further includes a third metal sublayer; and the third metal sublayer has a different material composition than the first metal sublayer and the second metal sublayer.

24. The integrated circuit of claim 23, wherein:

the first metal sublayer includes titanium tungsten (TiW);

the second metal sublayer includes aluminum copper (AlCu); and the third metal sublayer includes titanium nitride (TIN).

* * * * *